United States Patent [19]

Carlile et al.

[11] Patent Number: 5,339,039
[45] Date of Patent: Aug. 16, 1994

[54] LANGMUIR PROBE SYSTEM FOR RADIO FREQUENCY EXCITED PLASMA PROCESSING SYSTEM

[75] Inventors: Robert N. Carlile, Tucson, Ariz.; Sam G. Geha, Sunnyvale, Calif.

[73] Assignee: Arizona Board of Regents on Behalf of the University of Arizona, Tucson, Ariz.

[21] Appl. No.: 953,561

[22] Filed: Sep. 29, 1992

[51] Int. Cl.⁵ .............................................. C23C 14/00
[52] U.S. Cl. ................................. 324/655; 324/754; 204/192.33; 204/298.32; 315/111.21
[58] Field of Search ............... 118/50.1, 723; 156/643; 204/298.32-298.34, 192.33; 257/595-598; 313/231.31; 315/111.21, 111.81; 324/464, 655, 158 P, 682

[56] References Cited

U.S. PATENT DOCUMENTS

| | | | |
|---|---|---|---|
| 4,006,404 | 2/1977 | Szuszczewicz et al. | 324/72 X |
| 4,529,995 | 7/1985 | Sakai et al. | 257/598 |
| 5,122,251 | 6/1992 | Campbell et al. | 204/298.34 X |
| 5,167,748 | 12/1992 | Hall | 204/298.32 X |

OTHER PUBLICATIONS

*Capacitive Probes for rf Process Plasmas*, S. E. Savas et al., Rev. Sci. Instrum. 60 (11), Nov., 1989, pp. 3391–3395.
*A Tuned Langmuir Probe for Measurements in RF Glow Discharges*, A. P. Paranipe, J. Appl. Phys. 67(11), Jun. 1990, pp. 6718–6727.
*Use of Electric Probes in Silane Radio Frequency Discharges*, E. R. Mosburg, Jr. et al., J. Appl. Phys. 54(9), Sep. 1983, pp. 4916–4927.
*Langmuir Probe Characteristics in RF Glow Discharges*, N. Hershkowitz et al., Plasma Chemistry and Plasma Processing, vol. 8, No. 1, Dec. 1988, pp. 35–52.
*Pressure Dependence of Electron Temperature Using RF-Floated Electrostatic Probes in RF Plasmas\**, Applied Physics Letters, vol. 30, No. 7, Apr., 1977, pp. 316–319, Cantin et al.
*Floating Probe Methods*, J. D. Swift et al., Electrical Probes for Plasma Diagnostics, Dec. 1971, pp. 137–151.

*Primary Examiner*—Kenneth A. Wieder
*Assistant Examiner*—Christopher M. Tobin
*Attorney, Agent, or Firm*—Bell, Seltzer, Park & Gibson

[57] ABSTRACT

A Langmuir probe system for measuring plasma internal discharge parameters in a radio frequency excited plasma processing system includes an electrically tuned resonant circuit. The electrically tuned resonant circuit includes a semiconductor variable capacitor. Specifically, an inductor and FET are connected in parallel to form a resonant circuit used to electrically tune the Langmuir probe. The tuning circuit is placed within a moveable, electrically floating, probe housing and is electrically tuned to improve tuning accuracy and to reduce detuning during operation.

22 Claims, 3 Drawing Sheets

LANGMUIR PROBE SYSTEM FOR RADIO FREQUENCY EXCITED PLASMA PROCESSING SYSTEM

FIELD OF THE INVENTION

This invention relates to plasma processing systems, and more particularly to plasma processing systems operated at radio frequencies (RF).

BACKGROUND OF THE INVENTION

Plasma processing techniques are widely used for etching or depositing thin films on, or surface modification of, workpieces such as semiconductor substrates. As the density of semiconductor devices increases, plasma processing is being increasingly utilized because it can deposit films at lower temperatures than conventional techniques, can deposit a more conformal film, and can also deposit and etch films in situ.

A typical plasma processing system includes a plasma processing chamber and a workpiece holder for positioning the workpiece in the chamber. Inlet and outlet ports introduce a reactant gas or gases into the chamber. Electrodes are used to generate the plasma in the chamber from the reactant gas or gases. One or more of the electrodes are excited by a direct current (DC) voltage source or a radio frequency (RF) voltage source, often at 13.56 MHz.

A Langmuir probe is a device used for determining a plasma's internal discharge parameters in a plasma processing system, such as plasma densities, charged-particle concentrations, and energy distribution functions. The Langmuir probe is typically a metallic electrode of cylindrical, planar, or spherical geometry, which collects current from a plasma when a voltage is applied to the probe. The probe's current collection properties, often called the probe's "current-voltage (I-V) characteristic" or the "probe characteristic", yields information on the plasma's internal discharge parameters. The probe's current-voltage characteristic is very useful for studying plasma parameters in a wide variety of situations.

In the conventional approach to Langmuir probe operation, the probe is driven by a continuous voltage sweep such as a linear sawtooth voltage. In a DC discharge the plasma potential is invariant with time, and current-voltage characteristics are relatively easy to interpret in steady-state plasmas.

There has been considerable recent interest in RF glow discharge plasmas for plasma processing for use in etching and sputtering applications. However, in an RF discharge, the plasma potential fluctuates with time. This results in the collection of time-varying current by the Langmuir probe. Collection of time-varying current causes the current-voltage characteristic to distort, thereby causing error in the internal discharge parameter calculations.

Several techniques have been devised for reducing the error caused by the RF interference. For example, in a publication by E. Eser, R. E. Ogilvie, and K. A. Taylor, J. Vac. Sci. Technol. Vol. 15, p. 199, 1978, a method of reducing the error by filtering the probe characteristic leading to a time-averaged probe characteristic is disclosed. Unfortunately, the time-averaged probe characteristic does not correspond to the true probe characteristic because of the strong nonlinearity of the probe characteristic.

Another attempt to reduce the error caused by the RF interference is described in J. D. Swift and M. J. R. Schwar, *Electrical Probes for Plasma Diagnostics*, 137-151 (1971). In this text, floating double probes that ride up and down with the plasma potential and obtain a true DC probe characteristic are described. However, in addition to the physical limitations of double probes, it is difficult to completely float the DC voltage supply, and RF fields distort and generate spikes in the probe characteristic.

Another attempt to reduce the error caused by the RF interference is described in S. E. Savanas and K. G. Donohue, Proc. Gaseous Elec. Conf., 41, Paper PA-4 (1988). In the Savanas et al. paper, capacitive probes that have a high impedance to ground are used to monitor the time-varying plasma potential in an RF discharge. A numerical simulation of the effect of the time-varying potential on the probe characteristic is used to estimate the extent of the RF interference and correct the probe characteristic. The corrected probe characteristic is then used to estimate the plasma parameters. Unfortunately, this numerical simulation requires one to assume a Maxwellian electron energy distribution function, an assumption that is often highly erroneous. Also, if the plasma potential fluctuation is large, the probe might operate in electron saturation during part of the cycle, which violates assumptions made in the numerical simulation.

Another attempt to reduce the error caused by the RF interference is described in a publication entitled *Use of Electric Probes in Silane Radio Frequency Discharges*, by E. R. Mosburg, R. C. Kerns, and J. R. Abelson, J. Appl. Phys., Vol. 54, p. 4916, 1983. In the Mosburg et al. paper, to ensure that only a pure DC bias exists between the probe and the plasma, an RF signal is applied to the probe and adjusted in amplitude and phase to match the local time-varying plasma potential. Under these conditions, the probe characteristic obtained is equivalent to one obtained in a DC discharge. Unfortunately, in addition to difficulties created by the complex experimental arrangement, mismatch between the probe and plasma potential waveforms due to differences in harmonic content causes distortion of the probe characteristic.

Yet another attempt to reduce the error caused by the RF interference is described in a publication entitled *Pressure Dependance of Electron Temperature Using RF-Floated Electrostatic Probes in RF Plasmas*, by A. Cantin and R. R. J. Gagne, Appl. Phys. Lett., Vol. 30, p. 316, 1977. In the Cantin et al. paper, the RF voltage across the probe-plasma sheath is reduced to small values by using two probes. One of the probes acts as the Langmuir probe, while the other functions as a high impedance voltage probe that is used to sample the instantaneous plasma potential. The sampled voltage is fed to a unity gain amplifier (a follower circuit), whose output is connected to the Langmuir probe. Again, a complex arrangement is necessary.

Yet another attempt to reduce the error caused by the RF interference is described in *A Tuned Langmuir Probe For Measurements in RF Glow Discharges*, by Ajit P. Paranjpe, James P. McVittie and Sidney A. Self, J. Appl. Phys., Vol. 67, p. 6718, 1990. In the Paranjpe et. al paper, the RF voltage across the sheath is minimized by ensuring that the impedance of the sheath is small when compared to the impedance between the probe and ground. This is accomplished by using a passive circuit that effectively makes the Langmuir probe behave as if it were connected to a high impedance circuit. The probe is tuned for a particular plasma condition by manually mechanically adjusting a variable capacitor that is part of a tuning network outside the probe sheath. The probe is tuned by maximizing the floating potential. Unfortunately, this system requires that the probe be very short and fixed in position.

Notwithstanding the above improvements, there is still a need in the art for an improved system for reducing the error caused by the RF interference. In particular, there is a need to provide a system which reduces detuning of the probe during operation and a simple component arrangement to obtain plasma parameters.

SUMMARY OF THE INVENTION

It is therefore an object of the invention to provide an improved plasma processing system.

It is another object of the invention to provide an improved radio frequency (RF) plasma processing system.

It is a further object of the invention is provide an improved system which reduces detuning of the Langmuir probe during operation.

It is yet another object of the invention to provide an improved Langmuir probe system which reduces the complexity of the component arrangement.

These and other objects are provided according to the present invention by a Langmuir probe plasma processing system for measuring characteristics of a plasma which is excited by radio frequency (RF) energy. The Langmuir probe is electrically connected to a resonant circuit including an inductive means and a semiconductor variable capacitive means. The resonant circuit is tuned to reduce distortions which arise from the radio frequency energy by electrically adjusting an electrical input signal to electrically vary the semiconductor variable capacitive means. The resonant circuit is also electrically connected to a Langmuir probe energization input means, which provides an energization signal to the Langmuir probe and measures the characteristics of the plasma which is excited by radio frequency energy.

The semiconductor variable capacitive means of the present invention may be embodied in a number of ways. Preferably, the semiconductor variable capacitive means is a transistor, such as a field effect transistor. The field effect transistor's gate and body electrodes are electrically connected to the Langmuir probe, and the source and drain electrodes are electrically connected to the electrical input signal.

Use of a semiconductor variable capacitive means allows electrical tuning of the Langmuir probe system. This decreases the amount of detuning due to the plasma and allows tuning during operation. Use of a semiconductor variable capacitive means also facilitates the interface to other electrical devices.

In another aspect of the present invention, the resonant circuit is contained within, and is capacitively coupled to, an electrically conductive housing. Preferably, the electrically conductive housing is adapted for immersion in the radio frequency excited plasma, and is free of an electrical ground connection such that the electrically conductive housing electrically floats at the potential of the radio frequency plasma in which it is immersed.

The floating housing allows capacitive coupling to the plasma via the sheath which separates the housing and the plasma. This capacitive coupling reduces the impedance between the plasma and the current collecting probe tip of the Langmuir probe. This reduced impedance makes the tuned circuit more effective in eliminating distortions of the probe characteristic.

The tuning circuit of the present invention, including the semiconductor variable capacitive means, can be used by itself to improve a plasma processing system. Moreover, the electrically conductive housing of the present invention can be used with other circuits to improve a plasma processing system. However, the tuning circuit, including the semiconductor variable capacitive means, is preferably mounted inside the electrically conductive housing. The electrically conductive housing, with the tuning circuit including the semiconductor variable capacitive means mounted therein, is preferably moveable in the plasma processing chamber wall, so that the Langmuir probe can be moved about the plasma. The moveable, electrically tunable, distortion reducing Langmuir probe system allows accurate measurements of the plasma in a plasma processing system.

DESCRIPTION OF THE PREFERRED EMBODIMENT

The present invention now will be described more fully hereinafter with reference to the accompanying drawings, in which a preferred embodiment of the invention is shown. The invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
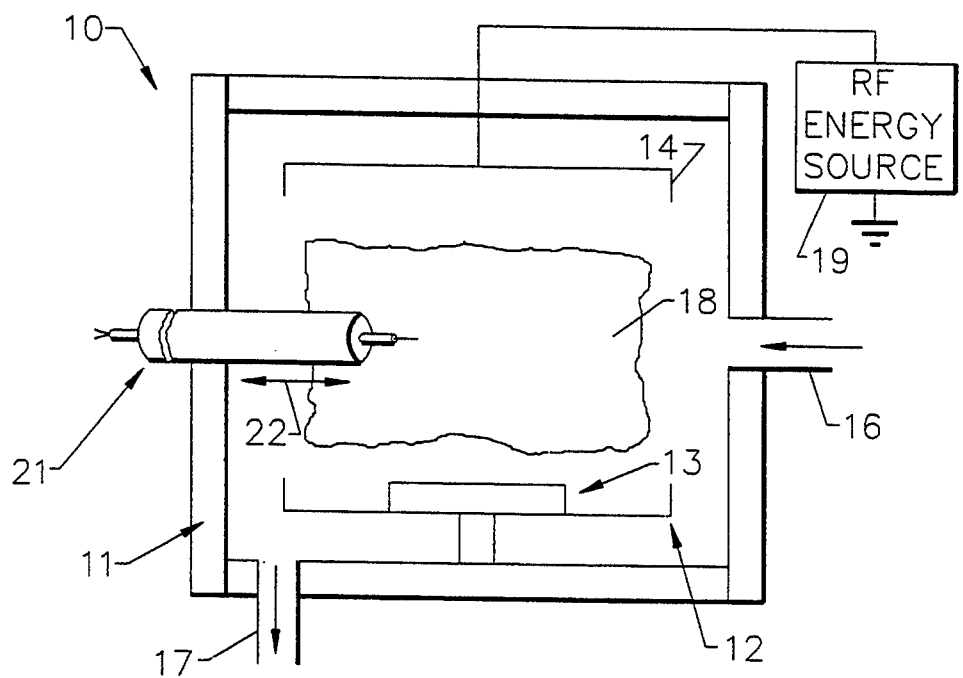
FIG. 1 is a schematic diagram of a plasma processing system including a Langmuir probe system according to the present invention.

Referring now to FIG. 1, a plasma processing system, including a Langmuir probe system, according to the present invention will now be described. As shown in FIG. 1, plasma processing system 10 includes a plasma processing chamber 11. The chamber 11 contains means 12 for holding a workpiece 13 in the chamber. Typically the means for holding a workpiece is a flat surface for accepting one or more semiconductor wafers. The chamber 11 also contains an inlet 16 and an outlet 17 for introducing reactant gases, used in forming a plasma 18, into the chamber 11, and means 14 for energizing the plasma 18 with radio frequency (RF) energy which is typically excited by an external RF voltage source 19.

The plasma processing system 10 also includes a Langmuir probe system 21, used to determine internal discharge parameters, such as plasma densities, charged-particle concentrations, and energy distribution functions, of the plasma 18. As shown in FIG. 1, Langmuir probe system 21 is preferably mounted within chamber 11 to permit movement transverse to the chamber wall, in the directions shown by arrows 22, so that the probe can be moved about the plasma.

Figure 2:
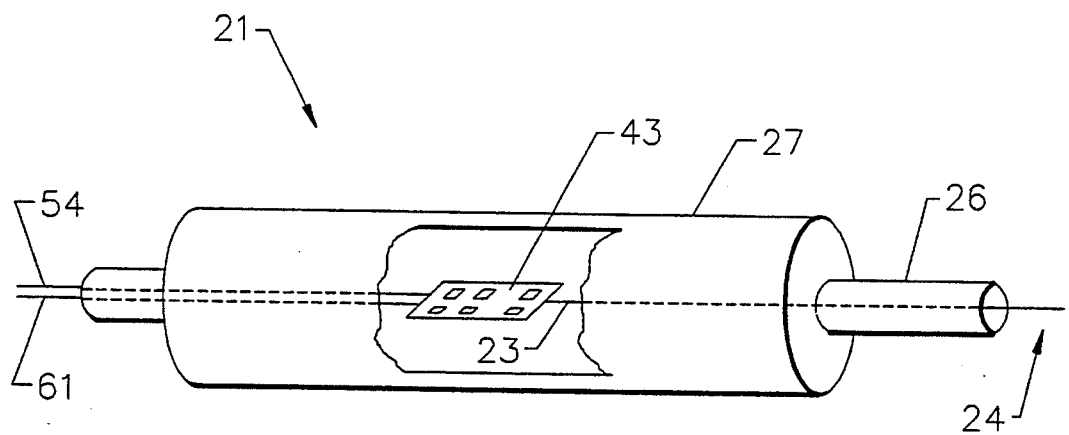
FIG. 2 is a schematic diagram of a Langmuir probe system of FIG. 1.

Referring now to FIG. 2, the Langmuir probe system 21 is made up of a metallic electrode 23, surrounded by an insulating cylinder 26. The Langmuir probe tip 24 is uninsulated and is used to collect current from a plasma for use in determining the plasma's internal discharge parameters when a voltage is applied. The Langmuir probe 21 current-voltage characteristic yields information on the plasma under investigation.

The Langmuir probe system also includes electrically conductive housing 27. For example, hollow stainless steel tubing may be used. The housing 27 preferably includes a circuit 43, mounted therein using conventional means not shown in FIG. 2. Circuit 43 includes a semiconductor variable capacitive means, as described in detail below. The system 21 is slideably mounted in chamber 11 such that the Langmuir probe tip 24 and at least some of the housing 27 are immersed in the plasma and may be moved about the plasma. See FIG. 1. External leads 54 and 61 are also provided as described below.

Figure 3:
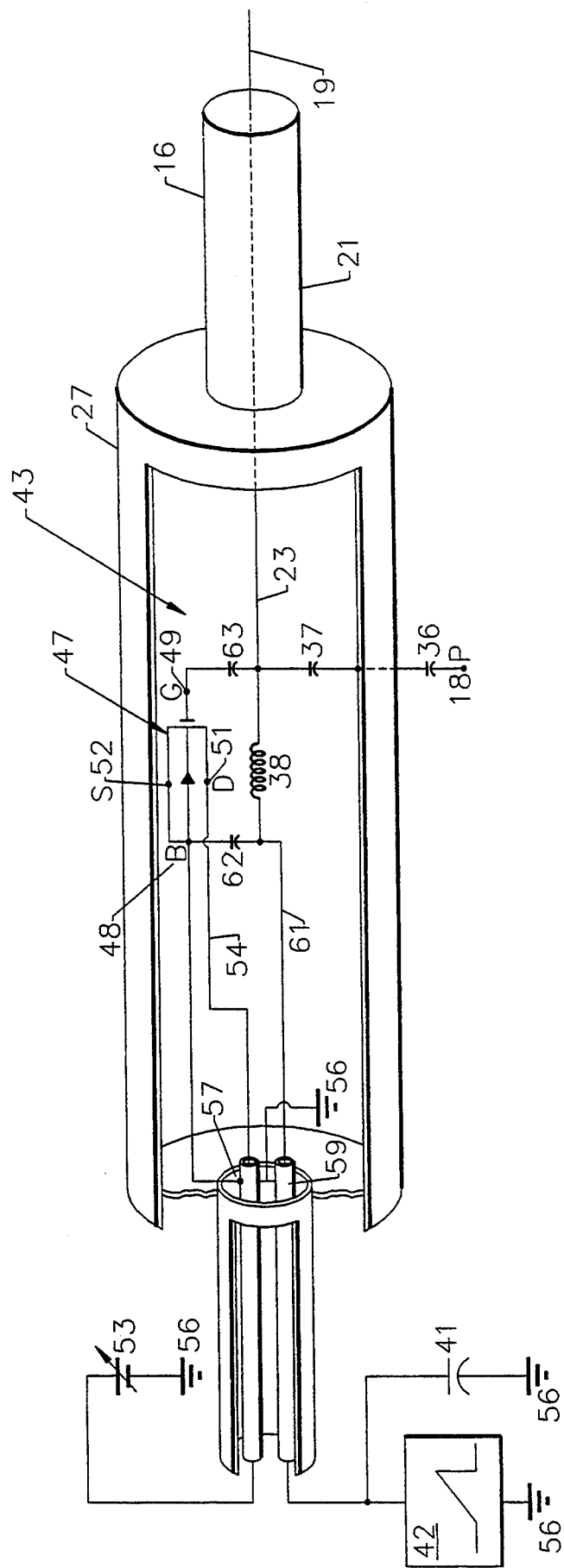
FIG. 3 is a schematic circuit diagram of an electrically tuned Langmuir probe tuning circuit according to the present invention.

Now referring to FIG. 3, circuit 43 is physically housed within the floating, electrically conductive housing 27. This system allows the Langmuir probe 21 to be manipulated in two-dimensions in order to measure plasma parameters at points in two-dimensions within the plasma. The floating housing 27 allows capacitive coupling to the plasma via the sheath which separates the housing and the plasma. This capacitive coupling reduces the impedance between the plasma and the current collecting probe tip of the Langmuir probe. This reduced impedance makes the tuned circuit more effective in eliminating distortions of the probe characteristic.

A variable capacitance is provided by a Field Effect Transistor 47 whose capacitance across the Body 48 and the Gate 49 can be varied and controlled by adjusting the voltage between the Drain 51 and the Source 52. A variable DC voltage source 53 is electrically connected to the Drain 51 by coaxial cable conductor 54 and to ground 56. Coaxial cable is used to electrically connect these elements due to the direct correlation between length of conductor and effect on the circuit impedance.

Figure 4:
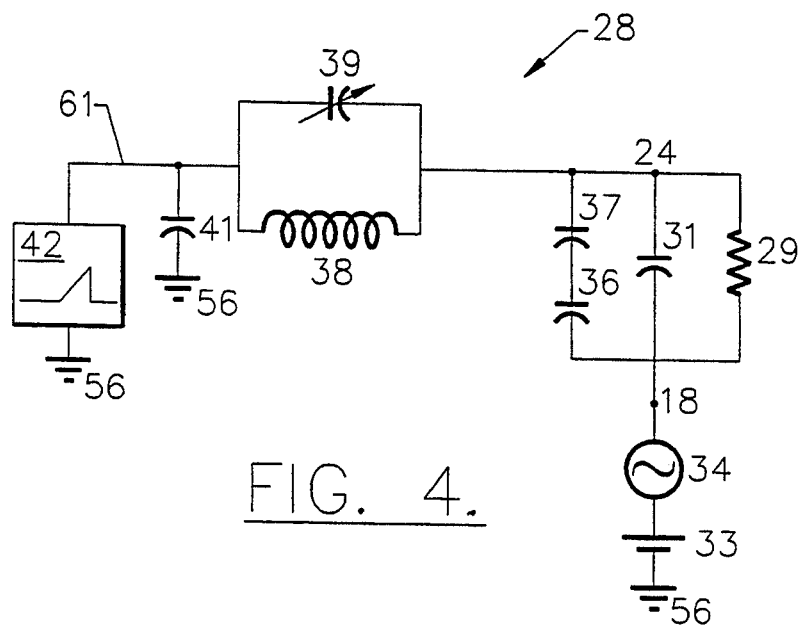
FIG. 4 is a schematic circuit diagram of the equivalent circuit of FIG. 3.

By adjusting the variable voltage source 53, the capacitance across the Body 48 and the Gate 49 may be adjusted to cause the circuit of FIG. 4 to resonate. The Body 48 and the Source 52 are electrically connected and are both electrically connected to a coaxial cable shield 57. Both coaxial cable conductor shields, 57 and 59, are electrically connected to ground 56.

The DC sweeping voltage source 42 is electrically connected to ground 56 and is in parallel with a capacitor 41. The DC source 42 is also electrically connected by a coaxial cable conductor 61 to an inductor 38 and is also electrically connected through an isolating capacitor 62 to the Body 48. The two isolating capacitors, 62 and 63, are used to prevent DC from entering the probe circuit. The values of the isolating capacitors 62 and 63 are chosen at values that will not affect the operation of the circuit but that will isolate the circuit from DC. For example, 100 pF may be used.

The inductor 38 is also electrically connected to the metallic electrode 23, to the Gate 49 through an isolating capacitor 63, and to the electrically floating housing 27 through a connecting capacitor 37. The capacitance 36 is the capacitance between the housing and the plasma. The capacitance between the Body 48 and the Gate 49, controlled by the variable voltage source 53, is electrically connected in parallel, through isolating capacitors 62 and 63, with the inductor 38. This parallel configuration forms the resonant circuit impedance used to tune the Langmuir probe system 10, thereby reducing the error in the plasma parameter calculations caused by the RF voltage 34, i.e. the error voltage.

Referring now to FIG. 4, the Langmuir probe plasma processing system equivalent circuit 28 illustrates the electrical interactions between the elements of the system. The equivalent circuit 28 is made up of a Langmuir probe tip 24 which is an uninsulated portion of a metallic electrode 23. The Langmuir probe tip 24 is immersed in a plasma 18 to collect current and determine the plasma's parameters. The sheath resistance 29 and sheath capacitance 31 are formed due to electrical interaction between the probe tip 24 and the plasma 18.

Figure 5:
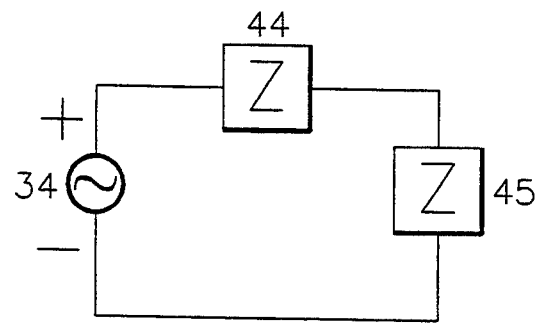
FIG. 5 is a schematic diagram of a time-invariant equivalent circuit of FIG. 3.

The plasma potential 18 consists of the time-averaged plasma potential 33 used to determine the plasma's parameters and the time varying part of the plasma potential 34. Interaction capacitance 36 is the capacitance between the plasma 18 and the floating housing 27 which is in series with the connecting capacitance 37. A capacitor 41 protects DC swept voltage source by shorting the RF current to ground. The DC swept voltage source and current monitor 42 is used to provide a sweeping DC voltage to the metallic electrode 23 and to measure the probe's current-voltage characteristic. FIG. 5 is a reduced equivalent circuit of the circuit of FIG. 3. The combination of the sheath resistance 29, sheath capacitance 31, and the capacitors 36 and 37 in series, are represented as the sheath impedance 45 in FIG. 5. The combination of inductor 38, and the variable capacitance 39, form the resonant circuit impedance 44 in FIG. 5. The voltage source in FIG. 4 is the RF voltage 34.

To reduce the error measurement of the plasma characteristics to a minimum, the error current's effect on the DC current must be minimized. This is accomplished by ensuring that the RF voltage 34 occurring across the sheath impedance 45 is minimized, while causing most of the RF voltage 34 to occur across the resonant circuit impedance 44. The floating housing assists in reducing impedance 45.

It will be understood by those having skill in the art that, by the theory of voltage division and resonant circuit theory, to ensure that the RF voltage 34 occurring across the sheath impedance 45 is minimized, the variable capacitance 39 may be adjusted to cause the resonant circuit impedance 44 to resonate, thereby causing the sheath impedance 45 to be much less than the resonant circuit impedance 44.

Electrical tuning and placement of the tuning circuit within the floating housing allows the Langmuir probe 21 to be accurately tuned and remain tuned during operation. Placement of the tuning circuit within the floating housing permits movement of the Langmuir probe 21 in two-dimensions which allows measurement of plasma parameters in two-dimensions. Electrical tuning of the Langmuir probe 21 also facilitates interfacing with other electrical devices.

In the drawings and specifications, there have been disclosed typical preferred embodiments of the invention and, although specific terms are employed, they are used in a generic and descriptive sense only and not for purposes of limitation, the scope of the invention being set forth in the following claims.

That which is claimed is:

1. A Langmuir probe system for measuring characteristics of a plasma which is excited by radio frequency energy, comprising:
   a moveable Langmuir probe adapted for immersion and movement in said plasma;
   a moveable resonant circuit adapted for immersion and movement in said plasma, electrically connected to said moveable Langmuir probe, said moveable resonant circuit comprising:
   inductive means, electrically connected to said moveable Langmuir probe; and
   semiconductor variable capacitive means, electrically connected to said moveable Langmuir probe, wherein said semiconductor variable capacitive means is responsive to an electrical input signal for electrically varying the capacitance thereof and tuning the moveable resonant circuit to reduce distortions which arise from the radio frequency energy; and
   Langmuir probe energization input means, electrically connected to said moveable resonant circuit, for providing an energization signal to said moveable Langmuir probe, for measuring the characteristics of the plasma which is excited by radio frequency energy.

2. The Langmuir probe system of claim 1 wherein said semiconductor variable capacitive means is a transistor.

3. The Langmuir probe system of claim 2 wherein said transistor is a field effect transistor.

4. The Langmuir probe system of claim 3 wherein said field effect transistor comprises source, drain and gate electrodes, wherein said gate electrode is electrically connected to said Langmuir probe, and wherein said source and said drain electrodes are electrically connected to said electrical input signal.

5. The Langmuir probe system of claim 1 further comprising an electrically conductive housing, wherein said resonant circuit is contained within said electrically conductive housing and capacitively coupled thereto.

6. The Langmuir probe system of claim 5 wherein said electrically conductive housing is adapted for immersion in a radio frequency excited plasma and for movement in the radio frequency excited plasma in which it is immersed.

7. The Langmuir probe system of claim 6 wherein said electrically conductive housing is free of an electrical ground connection, such that said electrically conductive housing electrically floats at the potential of the radio frequency plasma in which it is immersed.

8. A Langmuir probe system for measuring characteristics of a plasma which is excited by radio frequency energy, comprising:
   a Langmuir probe;
   an electrically conductive housing adjacent said Langmuir probe, wherein said electrically conductive housing is adapted for immersion in a plasma and for movement in the plasma in which it is immersed, said electrically conductive housing being free of an electrical ground connection such that said electrically conductive housing electrically floats at the potential of the plasma in which it is immersed; and
   an electrical circuit within said electrically conductive housing and electrically connected to said Langmuir probe and said electrically conductive housing;
   wherein said electrical circuit comprises a resonant circuit, electrically connected to said Langmuir probe, said resonant circuit comprising:
   inductive means, electrically connected to said Langmuir probe; and
   semiconductor variable capacitive means, electrically connected to said Langmuir probe, wherein said semiconductor variable capacitive means is responsive to an electrical input signal for electrically varying the capacitance thereof and tuning the resonant circuit to reduce distortions which arise from the radio frequency energy; and
   wherein said Langmuir probe system further comprises Langmuir probe energization input means, electrically connected to said resonant circuit, for providing an energization signal to said Langmuir probe, for measuring the characteristics of the plasma which is excited by radio frequency energy.

9. The Langmuir probe system of claim 8 wherein said semiconductor variable capacitive means is a transistor.

10. The Langmuir probe system of claim 9 wherein said transistor is a field effect transistor.

11. The Langmuir probe system of claim 10 wherein said field effect transistor comprises source, drain and gate electrodes, wherein said gate electrode is electrically connected to said Langmuir probe, and wherein said source and said drain electrodes are electrically connected to said electrical input signal.

12. A plasma processing system comprising:
   a plasma processing chamber;
   means for holding a workpiece in said plasma processing chamber;
   means for forming a plasma within said plasma processing chamber;
   radio frequency energization means, for energizing the plasma with radio frequency energy;
   a moveable Langmuir probe within said plasma processing chamber, adapted for immersion and movement in said plasma;
   a moveable resonant circuit within said plasma processing chamber adapted for immersion and movement in said plasma, electrically connected to said moveable Langmuir probe, said moveable resonant circuit comprising:
   inductive means, electrically connected to said Langmuir probe; and
   semiconductor variable capacitive means, electrically connected to said moveable Langmuir probe, wherein said semiconductor variable capacitive means is responsive to an electrical input signal for electrically varying the capacitance thereof and tuning the resonant circuit to reduce distortions which arise from the radio frequency energy; and
   Langmuir probe energization input means, electrically connected to said moveable resonant circuit, for providing an energization signal to said moveable Langmuir probe, for measuring the characteristics of the plasma which is excited by radio frequency energy.

13. The plasma processing system of claim 12 wherein said semiconductor variable capacitive means is a transistor.

14. The plasma processing system of claim 13 wherein said transistor is a field effect transistor.

15. The plasma processing system of claim 14, wherein said field effect transistor comprises source, drain and gate electrodes, wherein said gate electrode is electrically connected to said Langmuir probe, and wherein said source and said drain electrodes are electrically connected to said electrical input signal.

16. The plasma processing system of claim 12 further comprising an electrically conductive housing, wherein said resonant circuit is contained within said electrically conductive housing and capacitively coupled thereto.

17. The plasma processing system of claim 16 wherein said electrically conductive housing is adapted for immersion in a radio frequency excited plasma and for movement in the radio frequency plasma in which it is immersed.

18. The plasma processing system of claim 17 wherein said electrically conductive housing is free of an electrical ground connection, such that said electrically conductive housing electrically floats at the potential of the radio frequency plasma in which it is immersed.

19. A plasma processing system comprising:
a plasma processing chamber;
means for holding a workpiece in said plasma processing chamber;
means for forming a plasma within said plasma processing chamber;
radio frequency energization means, for energizing the plasma with radio frequency energy;
a Langmuir probe within said plasma processing chamber and immersed in said plasma;
an electrically conductive housing, moveably mounted within said plasma processing chamber and immersed in said plasma, said electrically conductive housing being free of an electrical ground connection such that said electrically conductive housing electrically floats at the potential of the plasma in which it is immersed; and
an electrical circuit within said electrically conductive housing and electrically connected to said Langmuir probe and said electrically conductive housing;
wherein said electrical circuit comprises a resonant circuit, electrically connected to said Langmuir probe, said resonant circuit comprising:
inductive means, electrically connected to said Langmuir probe; and
semiconductor variable capacitive means, electrically connected to said Langmuir probe, wherein said semiconductor variable capacitive means is responsive to an electrical input signal for electrically varying the capacitance thereof and tuning the resonant circuit to reduce distortions which arise from the radio frequency energy; and
wherein said Langmuir probe system further comprises Langmuir probe energization input means, electrically connected to said resonant circuit, for providing an energization signal to said Langmuir probe, for measuring the characteristics of the plasma which is excited by radio frequency energy.

20. The plasma processing system of claim 19 wherein said semiconductor variable capacitive means is a transistor.

21. The plasma processing system of claim 20 wherein said transistor is a field effect transistor.

22. The plasma processing system of claim 21 wherein said field effect transistor comprises source, drain and gate electrodes, wherein said gate electrode is electrically connected to said Langmuir probe, and wherein said source and said drain electrodes are electrically connected to said electrical input signal.

* * * * *

UNITED STATES PATENT AND TRADEMARK OFFICE
CERTIFICATE OF CORRECTION

PATENT NO. : 5,339,039
DATED : August 16, 1994
INVENTOR(S) : KUMAGAI et al.

It is certified that error appears in the above-indentified patent and that said Letters Patent is hereby corrected as shown below:

ON THE COVER PAGE:

Reads: [75] Inventors: Eryohei Kumagai; Kaoru Hiiro; Harumi Shimizu; Tooru Takahashi, all of Tokyo, Japan Should Read: [75] Inventors: Ryohei Kumagai; Kaoru Hiiro; Harumi Shimizu; Tooru Takahashi, Manabu Oosaka, all of Tokyo, Japan Signed and Sealed this Twenty-third Day of April, 1996

Attest:

BRUCE LEHMAN

Attesting Officer

Commissioner of Patents and Trademarks